United States Patent
Brodoceanu et al.

(10) Patent No.: US 10,568,242 B1
(45) Date of Patent: Feb. 18, 2020

(54) DYNAMIC ADJUSTMENT OF PLACEMENT PARAMETERS FOR LIGHT EMITTING DIODES

(71) Applicant: Facebook Technologies, LLC, Menlo Park, CA (US)

(72) Inventors: Daniel Brodoceanu, Saarbrucken (DE); Alexander Udo May, St. Ingbert (DE)

(73) Assignee: Facebook Technologies, LLC, Menlo Park, CA (US)

(*) Notice: Subject to any disclaimer, the term of this patent is extended or adjusted under 35 U.S.C. 154(b) by 98 days.

(21) Appl. No.: 15/988,288

(22) Filed: May 24, 2018

(51) Int. Cl.
*G01R 31/02* (2006.01)
*H05K 13/00* (2006.01)
*H05K 1/18* (2006.01)
*G06T 7/00* (2017.01)
*H05K 13/08* (2006.01)
*H05K 13/04* (2006.01)

(52) U.S. Cl.
CPC ....... *H05K 13/0015* (2013.01); *G06T 7/0008* (2013.01); *H05K 1/181* (2013.01); *H05K 13/0413* (2013.01); *H05K 13/08* (2013.01); *G06T 2207/30148* (2013.01); *H05K 2201/10106* (2013.01)

(58) Field of Classification Search
CPC .............. G01R 1/0416; G01R 1/07342; G01R 31/2635; G02B 27/017; G01D 5/34; G01J 1/42; G01J 2001/4252; G01J 2003/2813; G01J 3/465; G01J 3/505; H05B 33/0803; H05B 33/089; H05B 37/04; H01L 25/0753; H01L 27/156; H01L 2224/16221; H01L 2224/16225; H01L 2224/81001; H01L 25/075; H01L 27/1248; H01L 27/1262; H01L 27/3244; H01L 33/0079; H01L 33/0095; H01L 33/20; G09G 2330/08; G09G 3/006; G09G 3/3225; H05K 13/0015; H05K 1/181; H05K 13/0413; H05K 2201/10106; G06T 7/008; G06T 2207/30148
See application file for complete search history.

(56) References Cited

U.S. PATENT DOCUMENTS

| | | | | |
|---|---|---|---|---|
| 7,148,127 B2* | 12/2006 | Oohata | ................. | G09G 3/006 438/469 |
| 8,349,116 B1* | 1/2013 | Bibl | ................. | H01L 21/67144 156/249 |
| 9,480,133 B2* | 10/2016 | Tischler | ............... | H05B 33/089 |
| 2019/0018057 A1* | 1/2019 | Pappas | ............... | G01R 31/2635 |
| 2019/0027075 A1* | 1/2019 | Hughes | ................. | H01L 27/156 |

FOREIGN PATENT DOCUMENTS

WO WO-2017/037475 A1 3/2017

* cited by examiner

*Primary Examiner* — Vinh P Nguyen
(74) *Attorney, Agent, or Firm* — Fenwick & West LLP

(57) ABSTRACT

Embodiments relate to placing one or more light emitting diodes (LEDs) onto a printed circuit board (PCB). Voltage differences are applied to the PCB such that, if properly placed, the one or more LEDs emit light. A camera records the placement and any light emitted from the one or more LEDs. Based upon the images from the camera, a controller can adjust placement parameters of the LEDs until they emit light. Among other advantages, the placement of the LEDs on the PCB can be adjusted in real time and allows insight into the causes of failed LED placement.

20 Claims, 6 Drawing Sheets

700

Place one or more light emitting diodes (LEDs) onto bumps on a substrate
702

Apply a voltage difference across the bumps
704

Determine emitting states of the LEDs responsive to placing the LEDs on the substrate and applying the voltage difference
706

Responsive to the determined emitting states of the LEDs failing one or more criteria, adjusting placement of the LEDs on the substrate
708

FIG. 7

DYNAMIC ADJUSTMENT OF PLACEMENT PARAMETERS FOR LIGHT EMITTING DIODES

BACKGROUND

The present disclosure relates to placement of light emitting diodes (LEDs) onto a substrate, and specifically, to dynamic adjustment of placement parameters during placement of the LEDs.

In display fabrication, LED dies may be moved from one substrate to another. For example, micro-LEDs of different colors may be transferred from carrier substrates to a display substrate including control circuits for the micro-LEDs to manufacture an electronic display. As the form factor of LEDs decreases, the placing of LEDs into desired arrangements and without damaging the LED dies becomes increasingly difficult.

SUMMARY

Embodiments relate to dynamically adjusting placement parameters for light emitting diodes (LEDs). One or more LEDs are placed onto conductive protrusions on a substrate. A voltage difference is applied across the conductive protrusions. Emitting states of the LEDs are determined responsive to placing the LEDs on the substrate and applying the voltage difference. The emitting states indicate emission of light from the LEDs. Responsive to the determined emitting states of the LEDs failing one or more criteria, the placement of the LEDs on the substrate is adjusted.

In some embodiments, an image of emission surfaces of the LEDs is captured by an image capturing device. The captured image is analyzed to determine the emitting states of the LEDs.

In some embodiments, the placement of the LEDs on the substrate is adjusted by adjusting a placing location of at least one of the LEDs, a placing angle of at least one of the LEDs, a placing pressure of at least one of the LEDs, a temperature or a temperature change during the placing of the LEDs onto the conductive protrusions, and a time for applying pressure and temperature during the placing of the LEDs onto the conductive protrusions.

In some embodiments, the LEDs are placed on the substrate by a pick and place head with a transparent portion through which the light emitted from the LEDs passes through to the image capturing device.

BRIEF DESCRIPTION OF DRAWINGS

Figure (FIG. 1 is a cross sectional view illustrating an operation of a pick-up head placing an LED onto a printed circuit board (PCB), according to one embodiment.

FIG. 7 is a flow chart illustrating a method for placing LEDs on a substrate, according to one embodiment.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to placing one or more light emitting diodes (LEDs) onto a printed circuit board (PCB). Voltage differences are applied to the PCB such that, if properly placed, the one or more LEDs emit light. A camera records the placement and any light emitted from the one or more LEDs. Based upon the images from the camera, a controller can adjust placement parameters of the LEDs until they emit light. Among other advantages, the placement of the LEDs on the PCB can be adjusted in real time and allows insight into the causes of failed LED placement.

Figure 1:
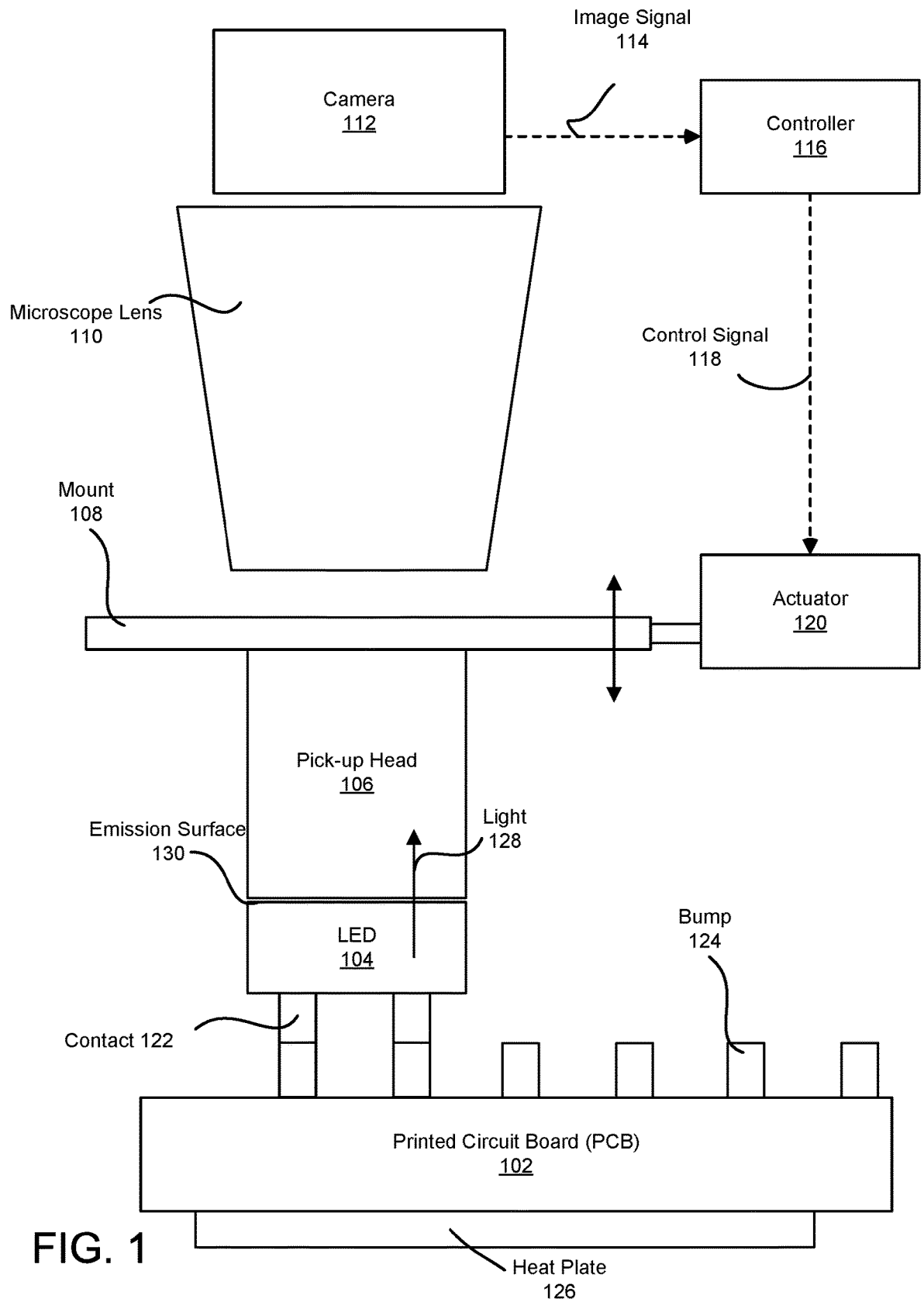

FIG. 1 is a cross sectional view illustrating an operation of a pick-up head 106 placing an LED 104 onto a PCB 102, according to one embodiment. The pick-up head 106 is attached to the LED 104 and places the LED 104 onto the PCB 102 by aligning bumps 124 of the PCB 102 with contacts 122 of the LED 104. If a voltage difference is applied between the bumps 124 and if the LED 104 is properly placed, the LED 104 can emit light 128 from an emission surface 130. A heat plate 126 is connected to the PCB 102. A camera 112 is placed above a microscope lens 110 to capture images of the LED 104 being placed onto the PCB 102 from the top. The camera 112 generates image signals 114 that function as real time feedback to correct improper LED 104 placement during the placement process. The camera 112 sends image signals 114 to the controller 116. Using the image signals 114, the controller 116 sends control signals 118 to the actuator 120. The actuator is attached to the pick-up head 106 via a mount 108. In some embodiments, FIG. 1 includes different and/or other components than those shown in FIG. 1.

The LED 104 is a surface-mounted device (SMD) that emits light 128 if a voltage difference is applied between the contacts 122. An LED 104 can have an epitaxial structure formed from, among other examples, Gallium nitride (GaN), gallium arsenide (GaAs), or gallium phosphide (GaP). In some embodiments, the LED 104 is a micro-LED (uLED) die. The LED 104 may also be embodied as a vertical-cavity surface-emitting laser (VCSEL) that emits infrared wavelengths. During or after placement of the LED 104 on the PCB 102, the LED 104 may be bonded to the PCB 102, for example, through thermocompression (TC) bonding. In some embodiments, the LED 104 includes a material to temporarily attach to the pick-up head 106. For example, the LED 104 includes an elastomeric material layer that allows the LED 104 to be adhesively attached to a pick-up surface of the pick-up head 106.

The PCB 102 is a substrate that mechanically supports and electrically connects electronic components using traces and bumps 124 (also referred to as conductive protrusions), among other components. The PCB 102 can support any number of LEDs 104. The PCB 102 may include circuits that are completed once one or more LEDs 104 are placed onto the PCB 102. In some embodiments, the circuits in the PCB 102 are powered so that the LED 104 emits light 128 as soon as electrical contact is established during the placement process. In some embodiments, the PCB 102 can include a control circuit that drives current in the PCB 102. For example, the PCB 102 is a display substrate of an electronic display. In this example, the pick-up head 106 may be placing LED dies at pixel or sub-pixel locations to connect the LED dies to control circuits in the display substrate. In this way, the control circuit can drive the electronic display by apply current to the LED dies. In some embodiments, the circuits in the PCB 102 are powered so that the LED 104 emits light 128 as soon as electrical contact is established during the placement process.

The pick-up head 106 places LEDs 104 onto the PCB 102. The pick-up head 106 may also be referred to as a pick and place head. The pick-up head 106 can support any number of LEDs 104 and can place multiple LEDs 104 onto the PCB 102 at once. Before placing the LED 104, the pick-up head 106 may pick up the LED 104 from a substrate, such as a carrier substrate. In some embodiments, a portion of the pick-up head 106 is transparent to allow the camera 112 to capture images of the LED 104 through the pick-up head 106.

The mount 108 is an actuated slide that supports the pick-up head 106. The mount 108 can support multiple pick-up heads 106. For example, the mount 108 supports two pick-up heads 106 such that two LEDs 104 can be placed at once. In some embodiments, the mount 108 is made of a transparent material, such as glass.

The actuator 120 is connected to the mount 108 and controls movement of the mount 108. By moving the mount 108, the actuator 120 aligns the pick-up head 106 with the PCB 102. This allows the pick-up head 106 to place one or more LEDs 104 on the PCB 102 by aligning the contacts 122 with the bumps 124. In some embodiments, the actuator 120 is a multiple degree of freedom actuator, such as an actuator that is configured to move the mount 108 up and down, left and right, forward and back. The actuator can also adjust yaw, tilt, or rotate the mount 108. In some embodiments, multiple actuators 120 connected to multiple mounts 108 perform LED 104 placement tasks in parallel to increase throughput.

The camera 112 is an image capturing device that captures the images of the LED 104 to determine whether the LED 104 is emitting light or not. The camera 112 can enable detection of luminance of the light emitted by the LED 104.

The microscope lens 110 magnifies light from the LED 104. The microscope lens 110 allows the camera 112 to view and distinguish light 128 from LEDs 104.

The controller 116 is a computing device that controls the placement of LEDs 104 by providing control signals 118 to the actuator 120. The control signals 118 are determined by the controller 116 and can be based on the image signals 114 received from the camera 112. Specifically, the controller 116 can analyze the emitting state of the LED 104 to determine if the placement of the LED 104 should be adjusted. The controller 116 is further described with reference to FIGS. 2 and 3.

The heat plate 126 is a plate that can control the temperature of the PCB 102 by heating or cooling the PCB 102. This may be advantageous for bonding the contacts 122 to the bumps 124 (e.g., by thermocompression bonding). In some embodiments, the temperature of the PCB 102 is controlled by another method or apparatus, such as a laser beam (e.g., sent through the pick-up head 106) that locally heats up the bumps 124 in contact with the contacts 122.

Figure 2:
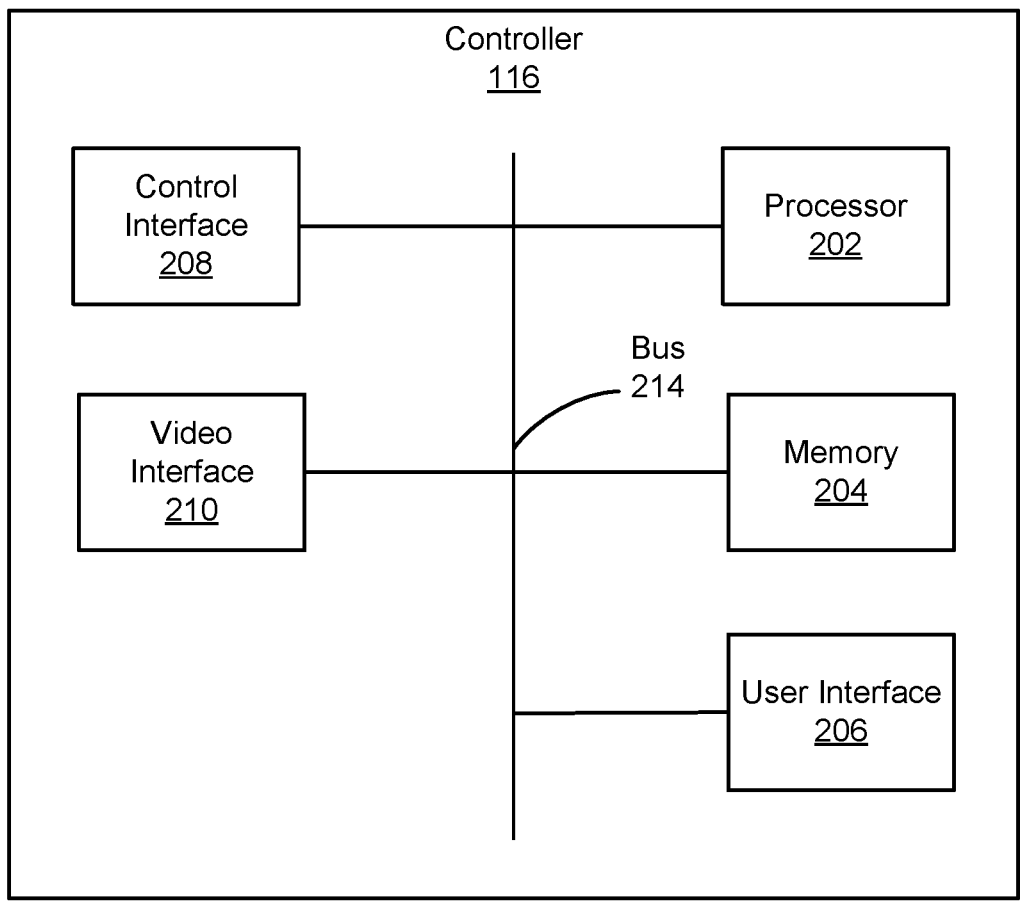
FIG. 2 is a block diagram of a controller of the pick-up head, according to one embodiment.

FIG. 2 is a block diagram of the controller 116, according to one embodiment. The controller 116 may include, among other components, a processor 202, a memory 204, a user interface 206, a video interface 210, and a control interface 208. The modules 202 through 208 communicate via a bus 214. Some embodiments of the controller 116 have different and/or other components than those shown in FIG. 2.

The controller 116 is a computer device that may be a personal computer (PC), a video game console, a tablet PC, a smartphone, or any machine capable of executing instructions (sequential or otherwise) that specify actions to be taken by that device. The controller 116 can operate as a standalone device or a connected (e.g., networked) device that connects to other machines. Furthermore, while only a single device is illustrated, the term "device" shall also be taken to include any collection of devices that individually or jointly execute instructions to perform any one or more of the methodologies discussed herein.

The processor 202 is a processing circuitry configured to carry out instructions stored in the memory 204. For example, the processor 202 can be a central processing unit (CPU) and/or a graphics processing unit (GPU). The processor 202 may be a general-purpose or embedded processor using any of a variety of instruction set architectures (ISAs). Although a single processor 202 is illustrated in FIG. 1, the controller 116 may include multiple processors 202. In multiprocessor systems, each of the processors 202 may commonly, but not necessarily, implement the same ISA. The processor 202, or a part of it, may be specifically designed for efficient processing of graphical images, such as those received in the image signals 114. For example, the processor 202 may perform one or more image processing steps to determine an emitting state of an LED 104.

The memory 204 is a non-transitory machine-readable medium on which is stored data and instructions (e.g., software) embodying any one or more of the methodologies or functions described herein. For example, the memory 204 may store instructions that when executed by the processor 202 configures the processor 202 to perform the method 700, described below in detail with reference to FIG. 7. Instructions may also reside, completely or at least partially, within the processor 202 (e.g., within the processor's cache memory) during execution thereof by the controller 116.

The term "machine-readable medium" should be taken to include a single medium or multiple media (e.g., a centralized or distributed database, or associated caches and servers) able to store instructions. The term "machine-readable medium" shall also be taken to include any medium that is capable of storing instructions for execution by the device and that cause the device to perform any one or more of the methodologies disclosed herein. The term "machine-readable medium" includes, but is not limited to, data repositories in the form of solid-state memories, optical media, and magnetic media.

The user interface 206 is hardware, software, firmware, or a combination thereof that enables a user to interact with the controller 116. The user interface 206 can include an alphanumeric input device (e.g., a keyboard) and a cursor control device (e.g., a mouse, a trackball, a joystick, a motion sensor, or other pointing instrument). For example, a user uses a keyboard and mouse to select placement parameters for placing a set of LEDs 104 on the PCB 102.

The control interface 208 transmits control signals 118 to the actuator 120. For example, the control interface 208 is a circuit or a combination of circuits and software that interfaces with the actuator 120 to transmit the control signals 118.

The video interface 210 is a circuit or a combination of circuit and software that receives image data via the image signals 114 from the camera 112 and transfers the image data to the memory 204 and/or processor 202 to be stored and processed.

The controller 116 executes computer program modules for providing functionality described herein. As used herein, the term "module" refers to computer program instructions and/or other logic used to provide the specified functionality. Thus, a module can be implemented in hardware, firmware, and/or software. In some embodiments, program modules formed of executable computer program instructions are loaded into the memory 204, and executed by the processor 202. For example, program instructions for the method 700 describe herein can be loaded into the memory 204, and executed by the processor 202.

Figure 3:
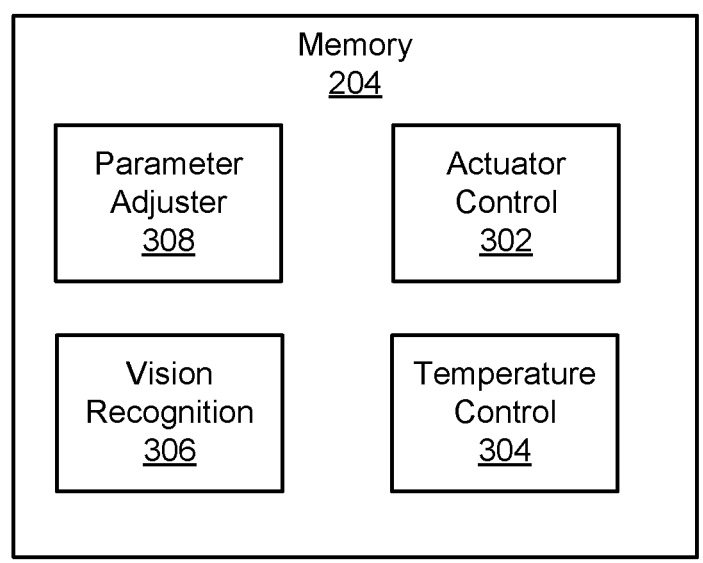
FIG. 3 is a block diagram of software modules in the memory of the controller, according to one embodiment.

FIG. 3 is a block diagram of software modules in the memory 204 of the controller 116, according to one embodiment. The memory 204 may store, among other modules, an actuator control module 302, a temperature control module 304, a vision recognition module 306, and a parameter adjuster module 308. The memory 204 may include other modules not illustrated in FIG. 3.

The actuator control module 302 provides instructions for generating control signals 118 to control the actuator 120 to adjust one or more placement parameters. The placement parameters are parameters that relate to placing one or more LEDs 104 on the PCB 102. The placement parameters include a placing location, a placing angle, a placing pressure, a placing temperature, and a placing time. The placing location is the location of the LED 104 on the PCB 102. The placing angle is the angle of the LED 104 relative to the PCB 102. The placing pressure is the pressure applied to the LED 104 by the pick-up head 106 once it is placed on the PCB 102. The placing time is the amount of time that the placing pressure and the placing temperature are applied to the LED 104. The placing temperature is the temperature of the PCB 102 or a temperature change of the PCB 102 during the placing of the LED 104. The temperature control module 304 sets the placing temperature by controlling the temperature of the heat plate 126. In some embodiments, the placement parameters also include heating ramp profile, flux behavior, underfill behavior, the influence of lateral movements (e.g. caused by thermal expansion) on placement formation, the influence of metal oxides, allowable pressure range, and allowable temperature range.

The heating ramp profile represents the temperature evolution during bonding. For example, the temperature can increase at a rate of 3° Celsius per second (C/s) up to 150° C., then increase at a rate of 10° C./s up to 270° C., then remain constant for five minutes (so called dwell time), then decrease at a controlled rate of 2° C./s. The heating ramp profile can be optimized experimentally and/or based on theoretical simulations.

Fluxes remove oxides during the bonding process (e.g., copper or tin oxides that can prevent a good bond). Underfills mechanically strengthen the bond structure by placing an additional material, such as a polymer, between the PCB 102 and LED 104. Since underfills can be liquid and freely move, their presence and evolution during bonding can be optically monitored during the bonding process (e.g., using the same optical feedback system for LED alignment and placement).

Lateral movement can occur as a result of heat expansion. Specifically, the pick-up head 106, the PCB 102, and the heat plate 126 can expand as their respective temperatures increase. The amount of expansion can depend on the coefficient of thermal expansion (CTE) of each material (e.g. it is proportional to the temperature and occurs in all directions). Pressure applied by the pick-up head 106 during the bonding process can also cause lateral movement (e.g., the pick-up head 106 can bulge). The vertical movement may be monitored and controlled such that the pressure between the PCB 102 and the LED 104 remains constant during bonding.

The vision recognition module 306 performs analysis on the image data in the image signals 114 to determine the emitting states of the LED 104. Specifically, the vision recognition module 306 determines whether an emitting state fails one or more criteria. The criteria form a standard for determining proper placement of one or more LEDs 104. For example, one of the criteria relates to whether the LED 104 emits light 128 or the LED 104 emits an amount of lumens above a threshold. An emitting state can fail the criteria for any number of reasons, such as, for example, an LED 104 is placed outside a target placing location, placing angle, placing time, placing pressure, placing temperature, etc.

The parameter adjuster module 308 provides instructions for monitoring the placement parameters and adjusting them in real time as needed. The parameter adjuster module 308 can adjust the placement parameters in response to one or more emitting states failing a criteria. The parameter adjuster module 308 may determine which parameters to adjust based on the failed criteria. For example, if an LED 104 is incorrectly placed on the PCB 102 (e.g., between bumps 124), the placing location can be adjusted. In another example, if the LED 104 moves after placement (this may indicate that the contacts 122 did not properly bond to the bumps 124), the placing time and pressure may be adjusted. The adjusted parameters can be temporarily adjusted for the LED 104 currently being placed or permanently adjusted for the current and future placement of LEDs 104. The parameter adjuster module 308 can continually adjust the placement parameters until one or more emitting states satisfy the criteria. This can allow for optimizing the placement parameters of the placement process and allow insight into root causes of failed LED 104 placement.

Figure 4:
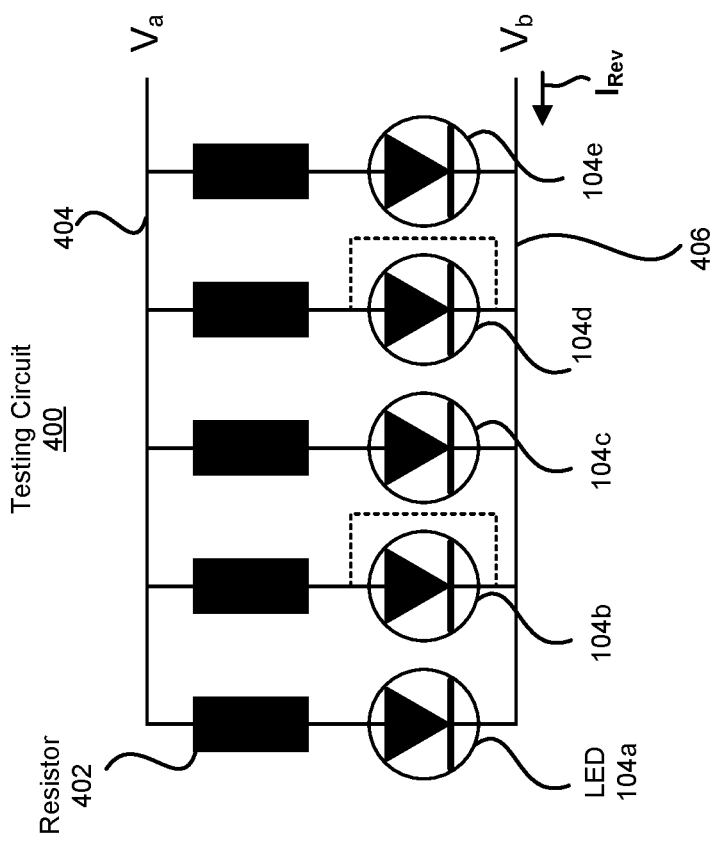
FIG. 4 is a circuit diagram of a testing circuit on a PCB, according to one embodiment.

FIG. 4 is a circuit diagram of a testing circuit 400 on a PCB 102, according to one embodiment. The testing circuit 400 can be used for experimental purposes, for example, to test a new placing scheme or new placement parameters. The arrangement of the testing circuit 400 allows parallel testing of the LEDs 104 on the circuit using only two connecting wires. The testing circuit 400 includes a top wire 404, a bottom wire 406, LEDs 104a through 104e (represented as diodes), and resistors 402 electrically connected between the top wire 404 and LEDs 104a through 104e. The dashed lines around LEDs 104b and 104d represent shorts between the bumps 124 on the PCB 102.

By applying a high supply voltage $V_a$ to the top wire 404 and low supply voltage $V_b$ to the bottom wire 406 ($V_a$>$V_b$), a voltage bias can be applied across the LEDs 104. As a result, LEDs 104a, 104c, and 104e will emit light 128. However, LEDs 104b and 104d will not emit light 128, due to the shorts. Despite the local circuit shorts near LED 104b and LED 104d, the resistors 402 prevent the entire testing circuit 400 from shorting. For example, the resistors 402 each have a resistance of 150 KΩ.

Furthermore, the relative voltage levels of applied voltages $V_a$, $V_b$ can be reversed to apply a negative voltage bias across the top and bottom wires ($V_a < V_b$). By doing so, reverse current $I_{Rev}$ flows from the bottom wire 406 to the upper wire 404 via the shorted LEDs 104b and 104d. The number of shorted LEDs in the testing circuit 400 can be estimated by measuring $I_{Rev}$. For example, if each shorted LED allows 10 μA of current to pass through, 20 μA of reverse current $I_{Rev}$ may indicate that two LEDs are shorted.

Assuming that the LEDs 104 are functioning properly (e.g., they were tested before being picked up by the pick-up head 106), the results of the positive and negative voltage bias can be used in combination with the images captured by the camera 112 to determine the number of improperly placed LEDs 104. For example, if no $I_{Rev}$ is measured, yet one or more LEDs 104 do not emit light 128 when current is in the forward direction ($V_a > V_b$), then it may be determined that one or more LEDs 104 were improperly placed on the PCB 102.

Figure 5:
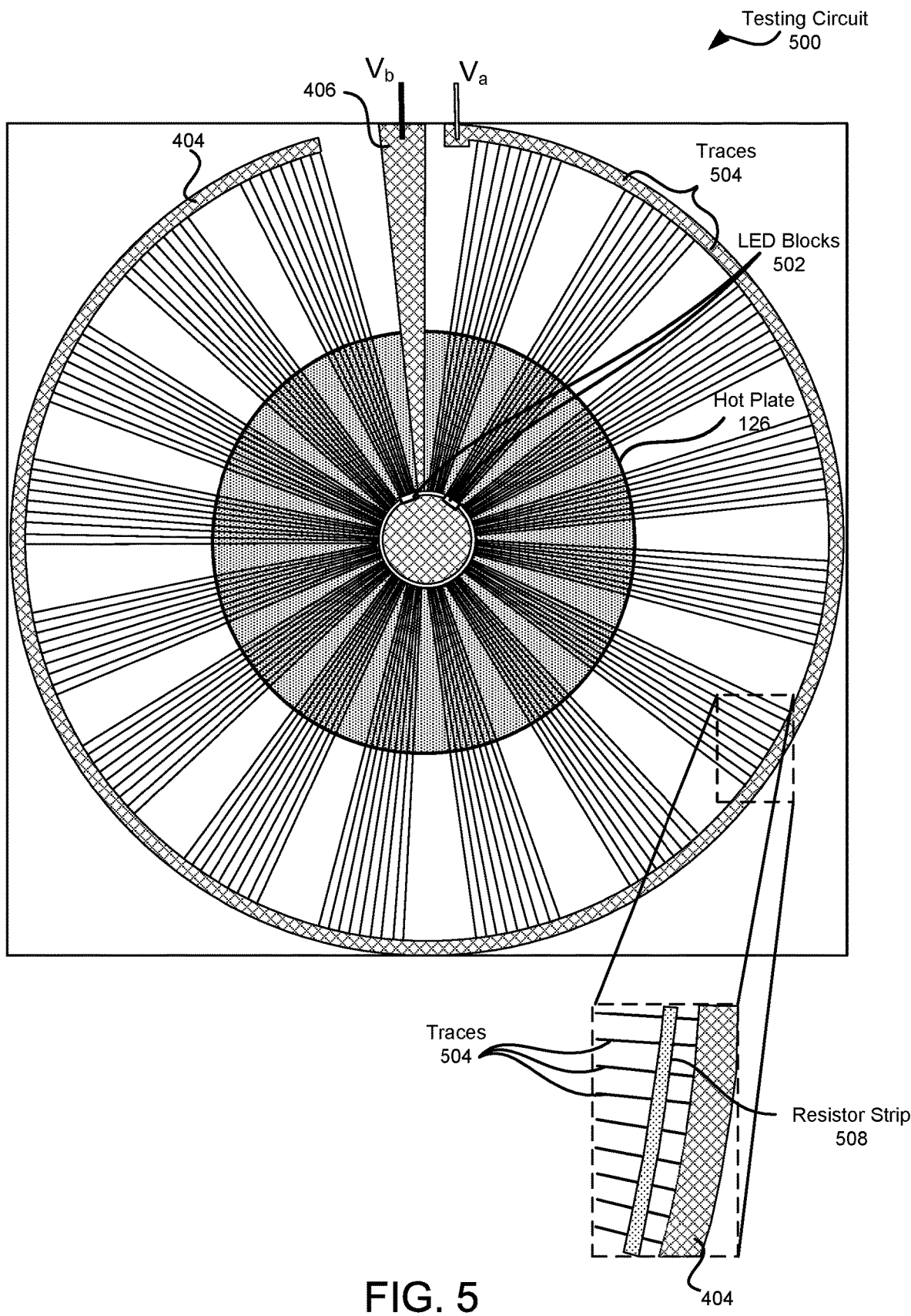
FIG. 5 is a diagram illustrating traces and resistor strip on a PCB, according to one embodiment.

FIG. 5 is a diagram illustrating a testing circuit 500 on a PCB 102 with traces 504 and a resistor strip 508, according to one embodiment. In addition to previously described components, the testing circuit 500 includes LED blocks 502, conductive traces 504, and a resistor strip 508 on a PCB 102 (not shown in FIG. 5). The traces 504 radially extend from the bottom wire 406 to the top wire 404. The resistor strip 508 is placed along severed segments of the traces 504 and the LED block 502 is connected to bumps 124 (not shown in FIG. 5) at the ends of the traces 504 to connect the top wire 404 to the bottom wire 406. Among other advantages, the emitting state of the LED block 502 can be detected by applying a voltage difference between the top wire 404 and bottom wire 406. In some embodiments, FIG. 5 includes different and/or other components than those shown in FIG. 5.

An LED block 502 includes one or more LEDs 104. For example, an LED block 502 is a block of connected LEDs 104. An LED block 502 can be placed by the pick-up head 106. Placing the LED block 502 may include aligning each of the contacts 122 of the LEDs 104 in the LED block 502 to a set of bumps 124. The resistor strip 508 (represented by the resistors 402) is a thin film of resistive material (e.g., AZO, carbon, etc.) deposited between severed segments of the metal traces 504 (e.g., near the top wire 404).

Figure 6:
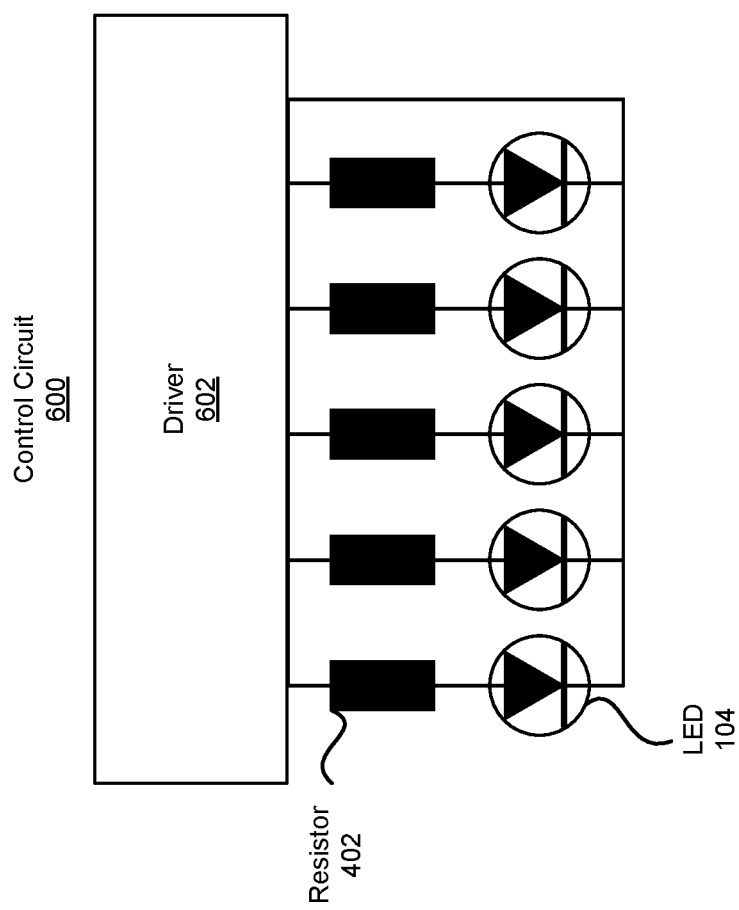
FIG. 6 is a circuit diagram of a control circuit on a PCB including a driver, according to one embodiment.

FIG. 6 is a circuit diagram of a control circuit 600 with a driver 602 on a PCB 102, according to one embodiment. Through the driver 602, the control circuit 600 can apply a voltage difference across any of the LEDs 104. The driver 602 may output voltages individually to each of the LEDs 104, selectively turning on or off the LEDs to determine which of the LEDs 104 is defective or which of the LEDs 104 were improperly placed. In some embodiments, the control circuit 600 is a part of a display substrate of an electronic display.

For applications that use all LEDs 104 on the PCB 102 to be functioning and properly placed (e.g., for an electronic display), the control circuit 600 can provide instant feedback for each LED 104 placed on the PCB 102. Thus, if an LED 104 on the substrate fails to emit light 128 (despite adjustment of the placement parameters), the substrate can be discarded before further LEDs 104 are placed on the PCB 102.

FIG. 7 is a flow chart illustrating a method for placing LEDs on a substrate, according to one embodiment. The steps of method 700 may be performed in different orders, and the method 700 may include different, additional, or fewer steps.

A pick-up head places 702 one or more LEDs onto bumps (also referred to as conductive protrusions) on a substrate. The substrate can be a PCB. The PCB can have any number of conductive protrusions. In some embodiments, the pick-up head is a pick and place head with a transparent portion through which light emitted from the LEDs can pass through. In some embodiments, placing the LEDs on the substrate comprises bonding the LEDs to the conductive protrusions by thermocompression bonding. In some embodiments, the pick-up head places the LEDs according to placement parameters. The placement parameters include a placing location, a placing angle, a placing pressure, a placing temperature, and a placing time.

A voltage difference is applied 704 across the bumps. When the voltage is applied, one or more of the LEDs may emit light depending on their placement. Depending on the circuit layout, a voltage difference may be simultaneously applied across all of the placed LEDs (e.g., in the case of a testing circuit) or across a single LED (e.g., in the case of a control circuit).

The emitting states of the LEDs are determined 706, responsive to placing the LEDs on the substrate and applying the voltage difference. An emitting state indicates emission of light from a LED. An emission state can be associated with one or more LEDs. In some embodiments, an image capturing device (such as a camera) captures one or more images of the emission surfaces of the LEDs. The emission states of the LEDs can be determined by analyzing the one or more images captured by the image capturing device.

When the determined emitting states of the LEDs fails one or more criteria, placement of the LEDs on the substrate is adjusted 708. Adjusting placement of the LEDs on the substrate can include adjusting the placement parameters. The criteria form a standard for determining proper placement of the one or more LEDs 104. The criteria can include a threshold amount of light emitted from the LEDs (individually or collectively). The criteria can also include any of the placement parameters or adjusted placement parameters. For example, an LED can fail a criterion if it was placed outside a target location on the PCB (even if it is properly emitting light). This may occur, for example, from an incorrect placing location parameter when the LED was initially placed. The criteria can also include a threshold amount of current passing through the LEDs (in either direction).

In some embodiments, after adjusting the placement of the LEDs and applying the voltage difference, the emitting states of the LEDs are determined again. After determining the emitting states for a second time, the placement of the LEDs can be adjusted again. This process can be repeated any number of times until the emitting states satisfy the criteria.

In some embodiments, the voltage difference across the bumps is applied by providing a forward bias current in the LEDs by connecting a first subset of the bumps to a first voltage via a resistor, and connecting a second subset of the bumps to a second voltage that is lower than the first voltage.

In some embodiments, determining the emitting states comprises providing reverse bias current in the LEDs by connecting the first subset of the bumps to the second voltage via the resistor and connecting the second subset of the bumps to the first voltage and measuring the reverse bias current to determine a number of shorted LED connections.

In some embodiments, the first subset of the bumps is connected to an outer conductive trace via radially extending conductive traces, each of the radially extending traces having severed segments that are connected via a resistance film that form the resistor.

In some embodiments, the voltage difference is applied sequentially across different subsets of the bumps to activate different LEDs or different emission regions on an LED (e.g., an LED block). The emitting states of the LEDs are determined by capturing a plurality of images sequentially, each of the images indicating the emission states when the different subsets of the bumps are applied with the voltage difference.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A method, comprising:
   (a) placing one or more light emitting diodes (LEDs) onto conductive protrusions on a substrate;
   (b) applying a voltage difference across the conductive protrusions;
   (c) determining emitting states of the LEDs indicating emission of light from the LEDs responsive to placing the LEDs on the substrate and applying the voltage difference; and
   (d) responsive to the determined emitting states of the LEDs failing one or more criteria, adjusting placement of the LEDs on the substrate.

2. The method of claim 1, wherein (c) determining the emitting states of the LEDs comprises:
   capturing, by an image capturing device, an image of emission surfaces of the LEDs; and
   analyzing the captured image to determine the emitting states of the LEDs.

3. The method of claim 2, wherein (a) placing the LEDs on the substrate is performed by a pick and place head having a transparent portion through which the light emitted from the LEDs passes through to the image capturing device.

4. The method of claim 1, wherein (a) placing the LEDs on the substrate comprises bonding the LEDs to the conductive protrusions by thermocompression bonding.

5. The method of claim 1, further comprising:
   (e) determining emitting states of the LEDs responsive to adjusting placement of the LEDs on the substrate and applying the voltage difference; and
   (f) repeating (d) and (e) until the determined emitting states satisfies the criteria.

6. The method of claim 1, wherein the adjusting the placement comprises adjusting one or more of: a placing location of at least one of the LEDs, a placing angle of at least one of the LEDs, a placing pressure of at least one of the LEDs, a temperature or a temperature change during the placing of the LEDs onto the conductive protrusions, and a time for applying pressure and temperature during the placing of the LEDs onto the conductive protrusions.

7. The method of claim 1, wherein (b) applying the voltage difference across the conductive protrusions comprises:
   providing forward bias current in the LEDs by connecting a first subset of the conductive protrusions to a first voltage wire via a resistor, and connecting a second subset of the conductive protrusions to a second voltage wire, a voltage at the second voltage wire lower than a voltage at the first voltage wire.

8. The method of claim 7, wherein (c) determining the emitting states comprises:
   providing reverse bias current in the LEDs by connecting the first subset of the conductive protrusions to the second voltage via the resistor, and connecting the second subset of the conductive protrusions to the first voltage; and
   measuring the reverse bias current to determine a number of LEDs that have shorted connections.

9. The method of claim 7, wherein the first subset of the conductive protrusions is connected to an outer conductive trace via radially extending conductive traces, each of the radially extending traces having severed segments that are connected via a resistance film that form the resistor.

10. The method of claim 1, wherein the voltage difference is applied sequentially across different subsets of the conductive protrusions to activate different LEDs or different emission regions on a LED, and wherein the emitting states of the LEDs are determined by capturing a plurality of images sequentially, each of the images indicating the emission states when the different subsets of the conductive protrusions are applied with the voltage difference.

11. The method of claim 1, wherein the substrate is a backplane of a display device that includes control circuitry for turning on or off the LEDs.

12. The method of claim 1, wherein the criteria comprising one or more of: whether the LEDs emit light, whether the LEDs emit an amount of lumens above a threshold, whether the LEDs are placed at a target placing location, whether the LEDs are placed at a target placing angle, whether the LEDs are placed at a target placing time, whether the LEDs are placed with a target placing pressure, and the LEDs are placed at a target placing temperature.

13. A non-transitory computer readable storage medium with instructions that when executed by a processor cause the processor to:
   (a) place one or more light emitting diodes (LEDs) onto conductive protrusions on a substrate;
   (b) apply a voltage difference across the conductive protrusions;
   (c) determine emitting states of the LEDs indicating emission of light from the LEDs responsive to placing the LEDs on the substrate and applying the voltage difference; and
   (d) responsive to the determined emitting states of the LEDs failing one or more criteria, adjust placement of the LEDs on the substrate.

14. The computer readable storage medium of claim 13, wherein the instructions (c) determining emitting states of the LEDs further cause the processor to:
   capture, by an image capturing device, an image of emission surfaces of the LEDs; and
   analyze the captured image to determine the emitting states of the LEDs.

15. The computer readable storage medium of claim 14, wherein (a) placing the LEDs on the substrate is performed by a pick and place head having a transparent portion through which the light emitted from the LEDs passes through to the image capturing device.

16. The computer readable storage medium of claim 13, wherein the instructions further cause the processor to:

(e) determine emitting states of the LEDs responsive to adjusting placement of the LEDs on the substrate and applying the voltage difference; and (f) repeat (d) and (e) until the determined emitting states satisfies the criteria.

17. The computer readable storage medium of claim 13, wherein adjusting the placement comprises adjusting a placing location of at least one of the LEDs, a placing angle of at least one of the LEDs, a placing pressure of at least one of the LEDs, a temperature or a temperature change during the placing of the LEDs onto the conductive protrusions, and a time for applying pressure and temperature during the placing of the LEDs onto the conductive protrusions.

18. A system, comprising:
a substrate with conductive protrusions;
a pick and place head carrying one or more light emitting diodes (LEDs); and
a controller configured to:
place, by the pick and place head, the one or more LEDs onto the conductive protrusions on the substrate,
apply a voltage difference across the conductive protrusions,
determine emitting states of the LEDs indicating emission of light from the LEDs responsive to placing the LEDs on the substrate and applying the voltage difference; and
responsive to the determined emitting states of the LEDs failing one or more criteria, adjust placement of the LEDs on the substrate.

19. The system of claim 18, further comprising an image capturing device configured to capture an image of emission surfaces of the LEDs, the captured image sent to the controller to determine the emitting states of the LEDs.

20. The method of claim 19, wherein the pick and place head has a transparent portion through which the light emitted from the LEDs passes through to the image capturing device.

* * * * *